(12) United States Patent
Pagaila

(10) Patent No.: US 8,304,277 B2
(45) Date of Patent: Nov. 6, 2012

(54) SEMICONDUCTOR DEVICE AND METHOD OF FORMING BASE SUBSTRATE WITH CAVITIES FORMED THROUGH ETCH-RESISTANT CONDUCTIVE LAYER FOR BUMP LOCKING

(75) Inventor: Reza A. Pagaila, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 78 days.

(21) Appl. No.: 12/878,661

(22) Filed: Sep. 9, 2010

(65) Prior Publication Data

US 2012/0061822 A1 Mar. 15, 2012

(51) Int. Cl.
*H01L 21/00* (2006.01)

(52) U.S. Cl. ... 438/55; 438/113; 257/737; 257/E21.599; 257/E21.499

(58) Field of Classification Search .................... 438/55, 438/106, 107, 113, 123–127; 257/737, 782, 257/787, E21.599, E21.499
See application file for complete search history.

(56) References Cited

U.S. PATENT DOCUMENTS

| 6,433,426 | B1 | 8/2002 | Ikegami | |
|---|---|---|---|---|
| 6,562,660 | B1 * | 5/2003 | Sakamoto et al. | 438/124 |
| 6,984,877 | B2 | 1/2006 | Lee et al. | |
| 7,443,015 | B2 | 10/2008 | Punzalan et al. | |
| 7,993,979 | B2 * | 8/2011 | Do et al. | 438/123 |
| 8,120,152 | B2 * | 2/2012 | Chang Chien et al. | 257/676 |
| 8,124,447 | B2 * | 2/2012 | Chang Chien et al. | 438/106 |
| 2004/0089879 | A1 | 5/2004 | Lee et al. | |
| 2005/0156291 | A1 | 7/2005 | Shiu et al. | |
| 2007/0170559 | A1 | 7/2007 | Camacho et al. | |
| 2007/0210425 | A1 | 9/2007 | Ramakrishna et al. | |

* cited by examiner

*Primary Examiner* — David Vu
(74) *Attorney, Agent, or Firm* — Robert D. Atkins; Patent Law Group: Atkins & Associates, P.C.

(57) ABSTRACT

A semiconductor device has a base substrate with first and second etch-resistant conductive layers formed over opposing surfaces of the base substrate. First cavities are etched in the base substrate through an opening in the first conductive layer. The first cavities have a width greater than a width of the opening in the first conductive layer. Second cavities are etched in the base substrate between portions of the first or second conductive layer. A semiconductor die is mounted over the base substrate with bumps disposed over the first conductive layer. The bumps are reflowed to electrically connect to the first conductive layer and cause bump material to flow into the first cavities. An encapsulant is deposited over the die and base substrate. A portion of the base substrate is removed down to the second cavities to form electrically isolated base leads between the first and second conductive layers.

20 Claims, 14 Drawing Sheets

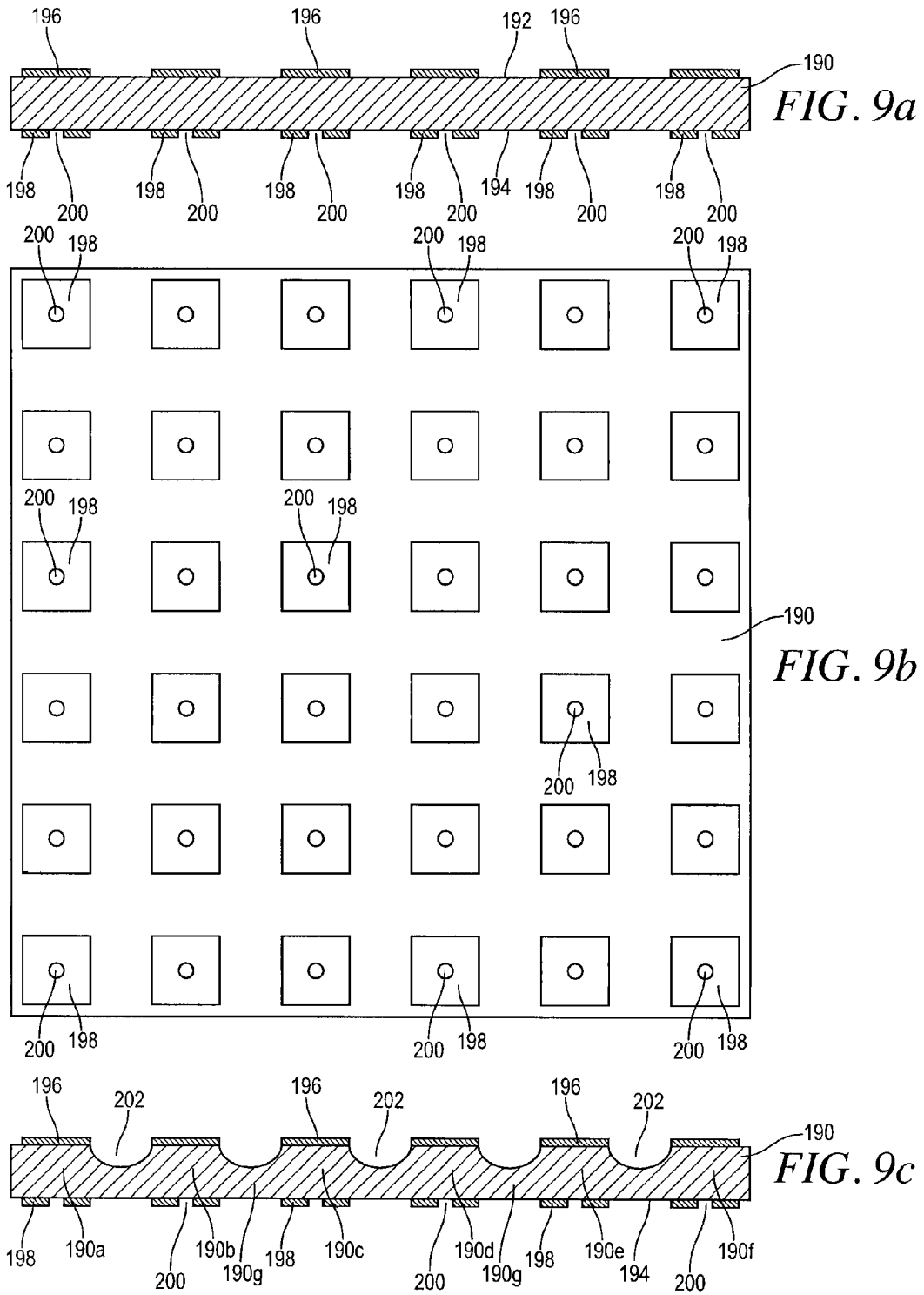

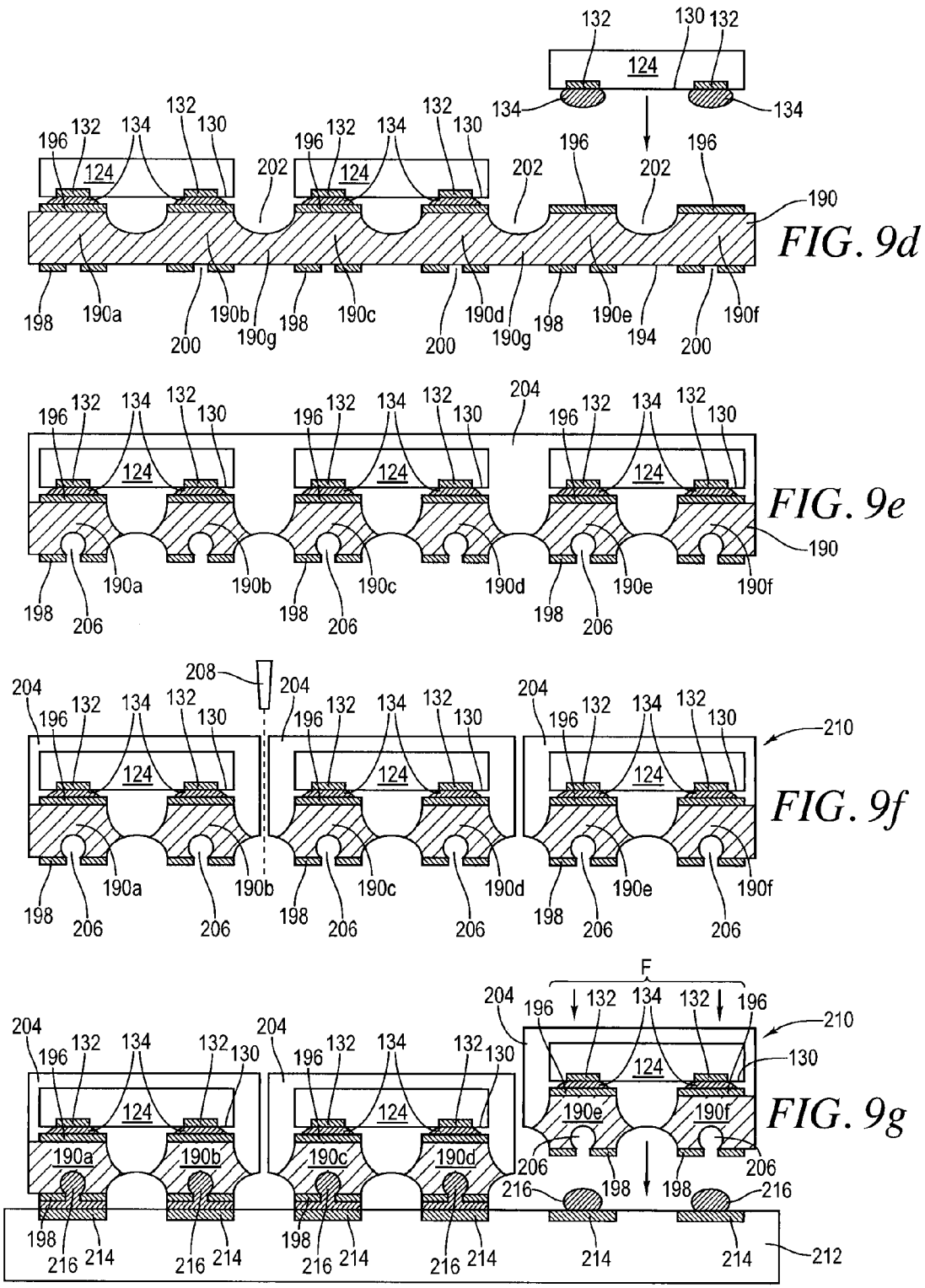

SEMICONDUCTOR DEVICE AND METHOD OF FORMING BASE SUBSTRATE WITH CAVITIES FORMED THROUGH ETCH-RESISTANT CONDUCTIVE LAYER FOR BUMP LOCKING

FIELD OF THE INVENTION

The present invention relates in general to semiconductor devices and, more particularly, to a semiconductor device and method of forming a wafer-level base substrate or leadframe with cavities formed through an etch-resistant conductive layer for bump locking.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Semiconductor devices are often stacked or mounted to a substrate for efficient integration. The electrical interconnection between semiconductor device and substrate, e.g., bump interconnect, is known to detach or delaminate under thermal or mechanical stress. The prior art has used several different techniques to make the electrical interconnect more robust. For example, the bumps can be reflowed or pressed into vias or holes of a lead to form a mechanical bond. However, the bond strength is limited to the shear strength between the surfaces of the mechanical bond.

SUMMARY OF THE INVENTION

A need exists to provide an electrical interconnect bond which is robust to thermal and mechanical stress. Accordingly, in one embodiment, the present invention is a method of making a semiconductor device comprising the steps of providing a base substrate having first and second opposing surfaces, forming a first etch-resistant conductive layer over the first surface of the base substrate, and etching a plurality of first cavities in the base substrate through an opening in the first etch-resistant conductive layer. The first cavities have a width greater than a width of the opening in the first etch-resistant conductive layer. The method further includes the steps of etching a plurality of second cavities in the base substrate between portions of the first etch-resistant conductive layer, providing a semiconductor die having a plurality of bumps formed over contact pads on an active surface of the semiconductor die, mounting the semiconductor die to the base substrate with the bumps disposed over the first etch-resistant conductive layer, reflowing the bumps to electrically connect to the first etch-resistant conductive layer and cause bump material to flow into the first cavities, depositing an encapsulant over the semiconductor die and base substrate, and removing a portion of the second surface of the base substrate down to the second cavities to form electrically isolated base leads under the first etch-resistant conductive layer.

In another embodiment, the present invention is a method of making a semiconductor device comprising the steps of providing a base substrate having first and second opposing surfaces, forming a first conductive layer over the first surface of the base substrate, forming a first cavity in the base substrate through an opening in the first conductive layer, forming a second conductive layer over the second surface of the base substrate, forming a second cavity in the base substrate between portions of the first conductive layer or second conductive layer, mounting a semiconductor die to the first conductive layer or second conductive layer, depositing an encapsulant over the semiconductor die and base substrate, and removing a portion of the base substrate down to the second cavity to form electrically isolated base leads between the first and second conductive layers.

In another embodiment, the present invention is a method of making a semiconductor device comprising the steps of providing a base substrate, forming a first conductive layer over a first surface of the base substrate, forming a cavity in the base substrate through an opening in the first conductive layer, mounting a semiconductor die to the base substrate, depositing an encapsulant over the semiconductor die and base substrate, and removing a portion of the base substrate to form electrically isolated base leads under the first conductive layer.

In another embodiment, the present invention is a semiconductor device comprising a base substrate and first conductive layer formed over a first surface of the base substrate with a cavity formed in the base substrate through an opening in the first conductive layer. A semiconductor die is mounted over the base substrate. An encapsulant is deposited over the semiconductor die and base substrate. A portion of the base substrate is removed to form electrically isolated base leads under the first conductive layer.

BRIEF DESCRIPTION OF THE DRAWINGS

FIGS. 9a-9g illustrate another process of forming a wafer-level base substrate with cavities formed through an etch-resistant conductive layer for locking bump material;

DETAILED DESCRIPTION OF THE DRAWINGS

Figure 1:
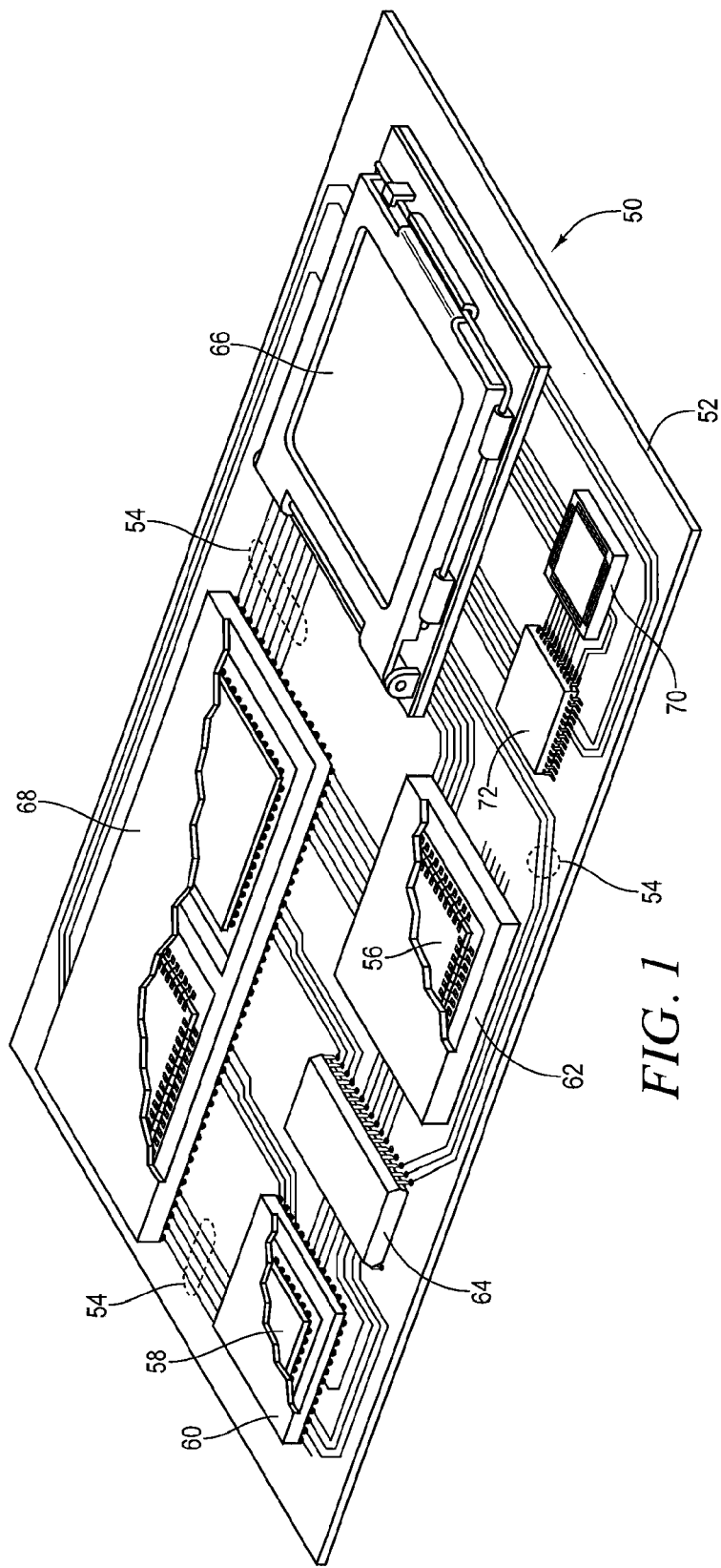
FIG. 1 illustrates a PCB with different types of packages mounted over its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted over a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
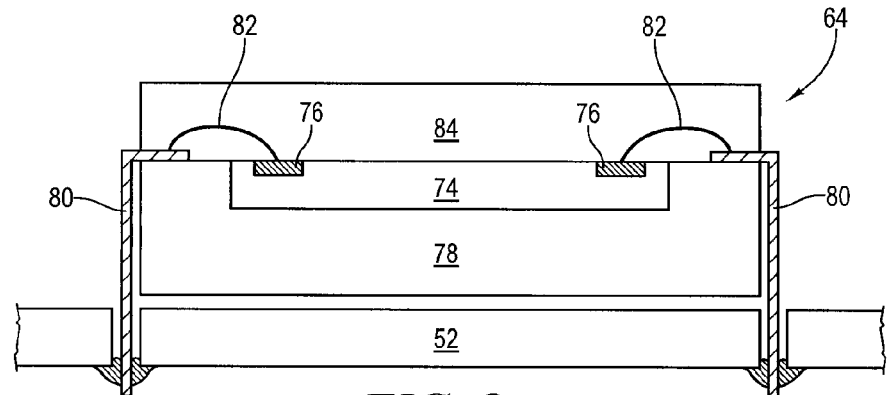
FIGS. 2a-2c illustrate further detail of the semiconductor packages mounted over the PCB.
Figure 2B:
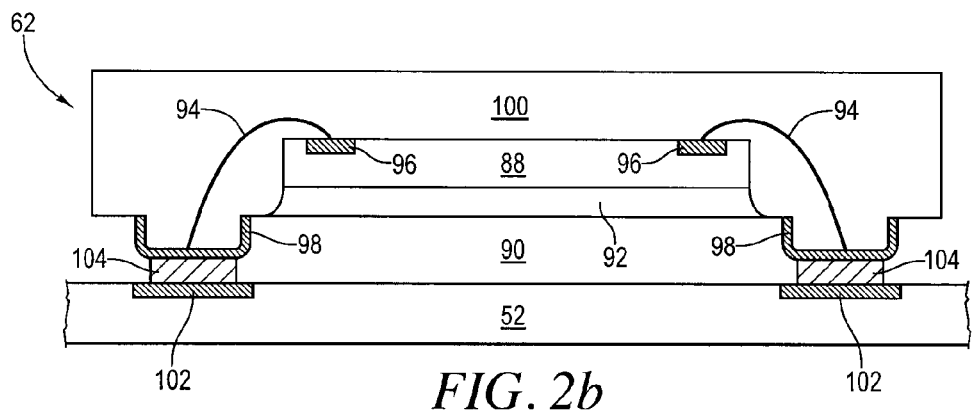
Figure 2C:
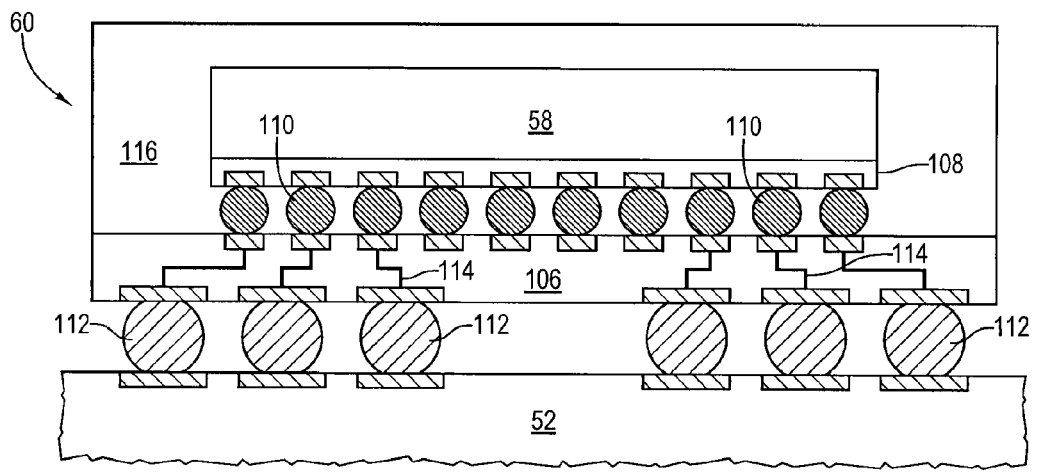

FIGS. 2*a*-2*c* show exemplary semiconductor packages. FIG. 2*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted over an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2*b* illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2*c*, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
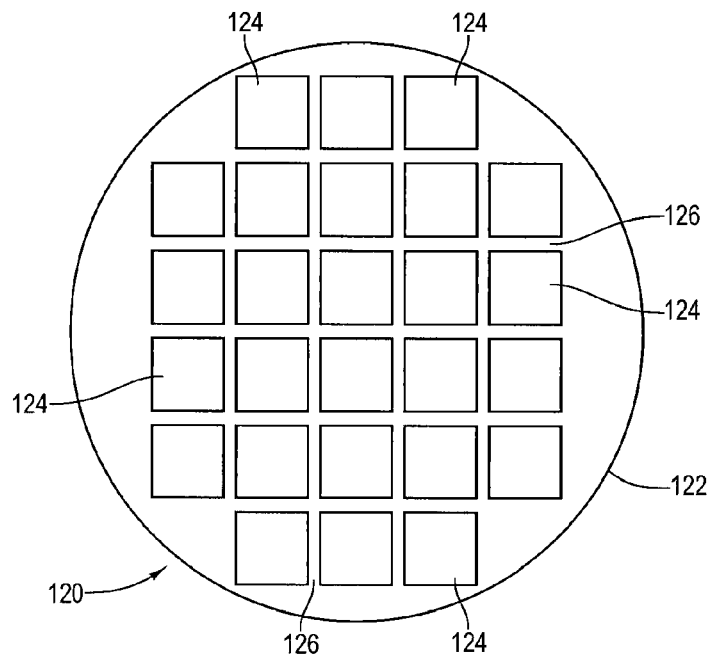
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126, as described above.

Figure 3B:
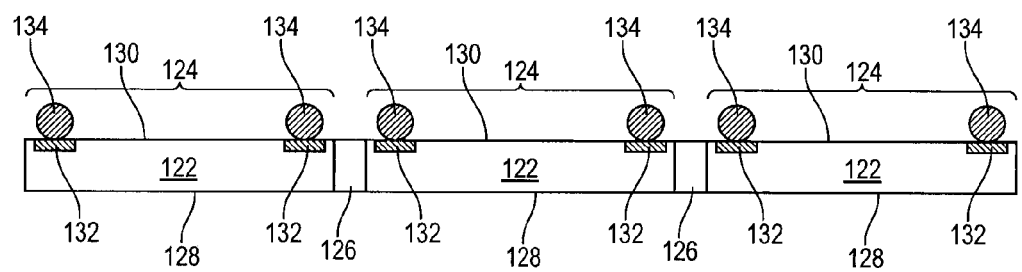

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Bumps 134 are formed on contact pads 132. In one embodiment, semiconductor die 124 is a flipchip type semiconductor die.

Figure 3C:
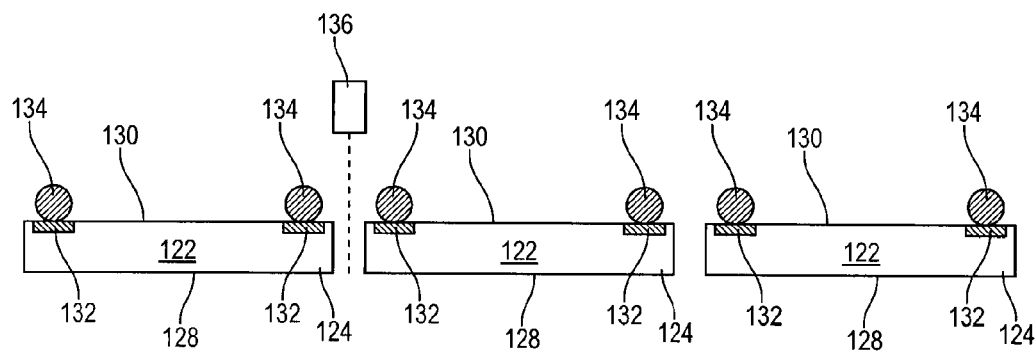

In FIG. 3c, semiconductor wafer 120 is singulated through saw street 126 using saw blade or laser cutting tool 136 into individual semiconductor die 124. Each semiconductor die 124 has bumps 134 formed over contact pads 132.

Figure 4A:
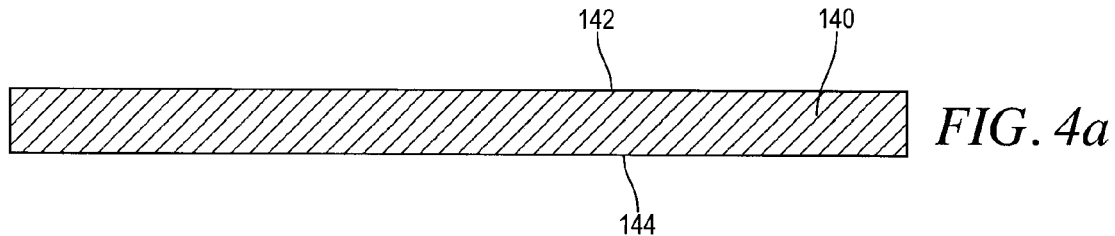
FIGS. 4a-4k illustrate a process of forming a wafer-level base substrate with cavities formed through an etch-resistant conductive layer for bump locking.

FIGS. 4a-4k illustrate, in relation to FIGS. 1 and 2a-2c, a process of forming a wafer-level base substrate with cavities formed through an etch-resistant conductive layer for bump locking. FIG. 4a shows a wafer-level base substrate or leadframe 140 containing Cu, Cu alloys, Al, or other suitable conductive material. Base substrate 140 has surface 142 and opposite surface 144. Wafer-level base substrate 140 has sufficient area to process multiple semiconductor die, as described below.

Figure 4B:
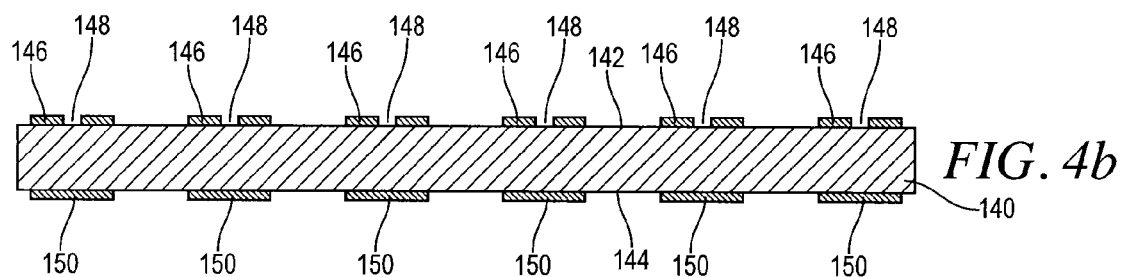

In FIG. 4b, an etch-resistant conductive layer 146 is formed over surface 142 of base substrate 140 using patterning and an electrolytic plating or electroless plating process. The location of conductive layer 146 over base substrate 140 corresponds to bump sites of subsequently mounted semiconductor die. An opening 148 is formed in a central area of each portion of conductive layer 146. The opening 148 can be formed by selective patterning or by removing a portion of conductive layer 146. FIG. 4c shows a plan view of openings 148 in conductive layer 146 over base substrate 140.

An etch-resistant conductive layer 150 is also formed over surface 144 of base substrate 140 using patterning and an electrolytic plating or electroless plating process. Conductive layers 146 and 150 can be one or more layers of Al, Cu, Sn, Ni, Au, Ag, or other suitable electrically conductive material. In one embodiment, conductive layers 146 and 150 are Ag or Au on a preplated leadframe (Ag/PPF plating). Conductive layers 146 and 150 operate as contact pads for later mounted semiconductor die or interconnect structures, such as bumps.

Figure 4D:
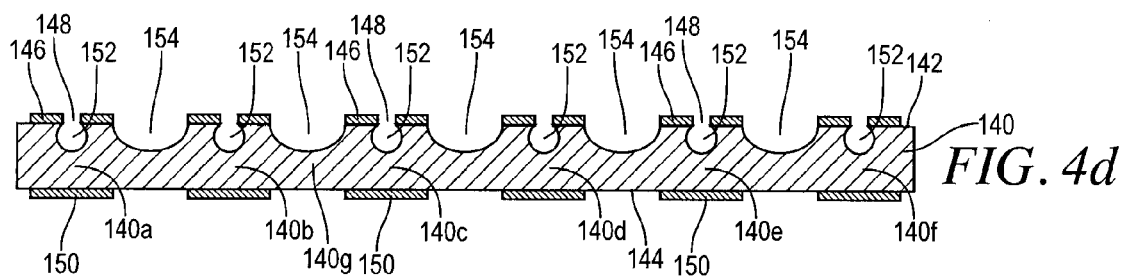
Figure 4E:
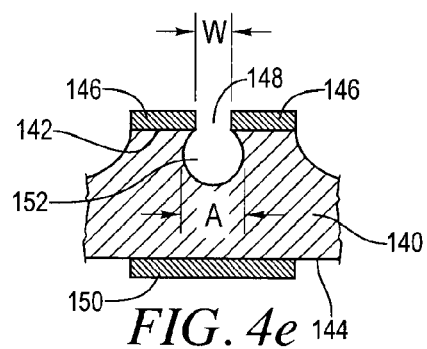
Figure 4C:
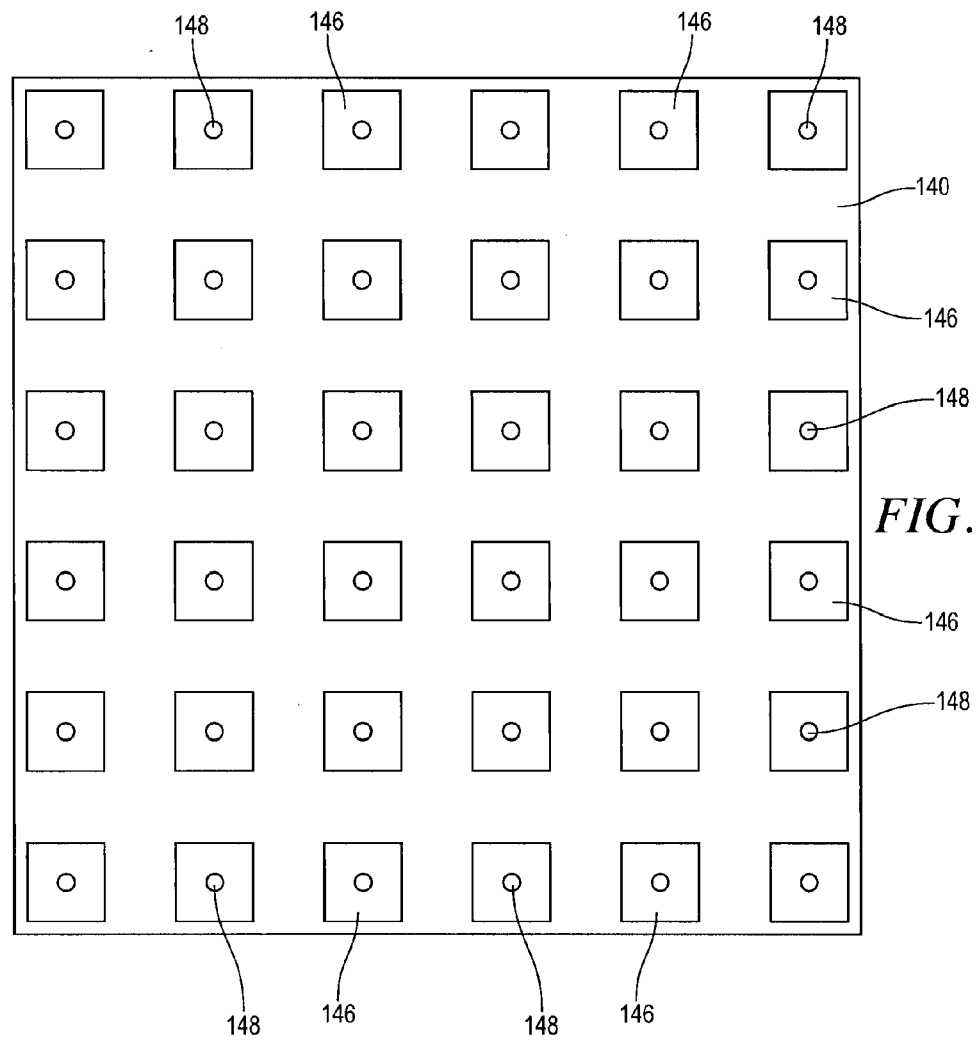

In FIG. 4d, base substrate 140 is etched partially through surface 142 to form cavities 152 through openings 148. The etching process also forms cavities 154 between portions of conductive layer 146. The etching to form cavities 152 and 154 is performed with an alkalized isotropic wet etchant. The Ag/PPF plating nature of conductive layers 146 and 150 are resistant to the etching process. The etchant reacts more aggressively in removing material within base substrate 140 than with conductive layers 146 and 150. Consequently, cavities 152 have a wider interior area A than the diameter or width D of opening 148, as shown in FIG. 4e. The cavities 154 create multiple rows of base leads or protrusions 140a, 140b, 140c, 140d, 140e, and 140f, extending from the remaining base substrate 140g. In one embodiment, cavities 152 are etched to a depth of 50-75 micrometers (μm) to ensure robust base leads 140a-140f.

Figure 4F:
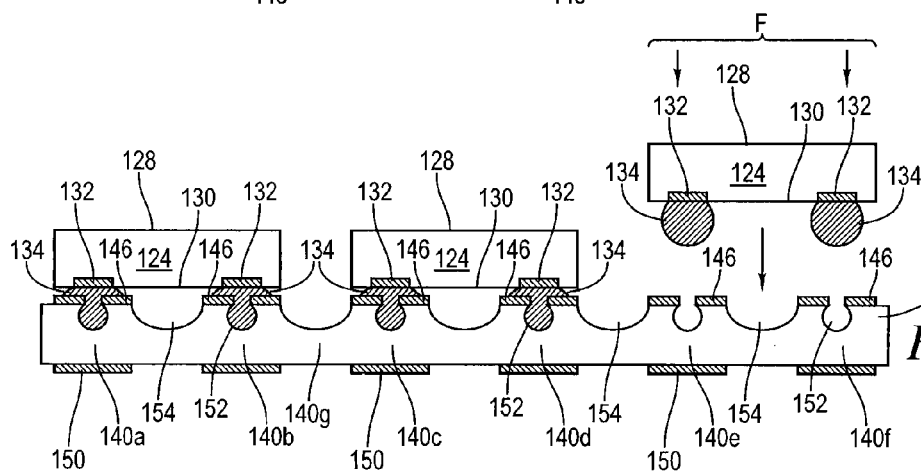
Figure 4G:
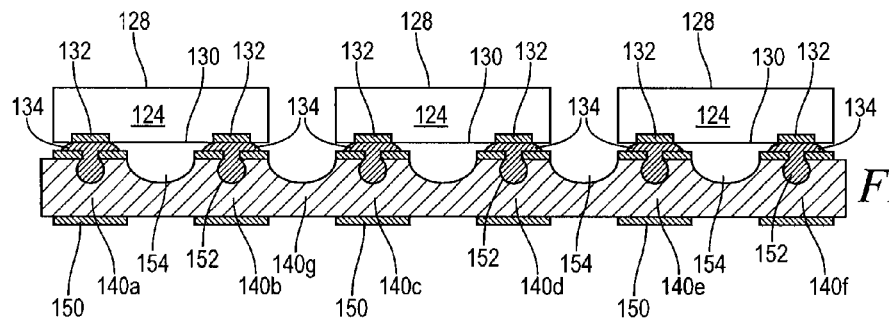

In FIGS. 4f-4g, semiconductor die 124 from FIGS. 3a-3c are positioned over and mounted to conductive layer 146 over base leads 140a-140f using a pick and place operation. Bumps 134 are metallurgically and electrically connected to conductive layer 146 and into cavity 152 by reflow and pressure. A force F can be applied to back surface 128 of semiconductor die 124 to assist with inserting the liquidus bump material into cavity 152. The requisite force to engage bumps 134 within cavities 152 can be achieved in a vacuum. In the case of stud bumps, thermo-compression bonding can be used to engage bumps 134 within cavity 152. Given the wider interior area A than the width W of opening 148, bumps 134 are locked to base leads 140a-140f. Bumps 134 are robust against detachment from conductive layer 146 by nature of the wider interior area A and narrower width W of opening 148. That is, the solidified bump material within the wider interior area A will not pass through the narrower width W of opening 148 in conductive layer 146. In another embodiment, one or more discrete semiconductor components can be mounted to conductive layer 146 over base leads 140a-140f.

Figure 4H:
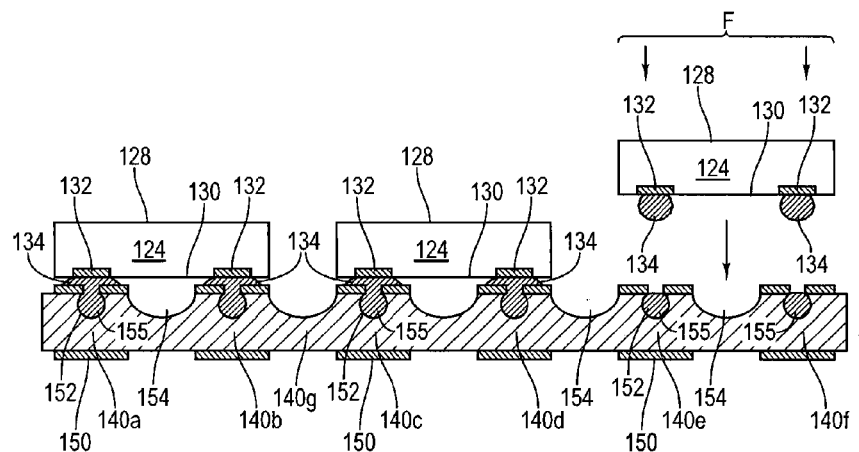

FIG. 4h shows another embodiment with bump material 155 deposited into cavities 152 prior to mounting semiconductor die 124. The pre-deposited bump material metallurgically joins with bumps 134 during reflow to form the bump lock feature.

Figure 4I:
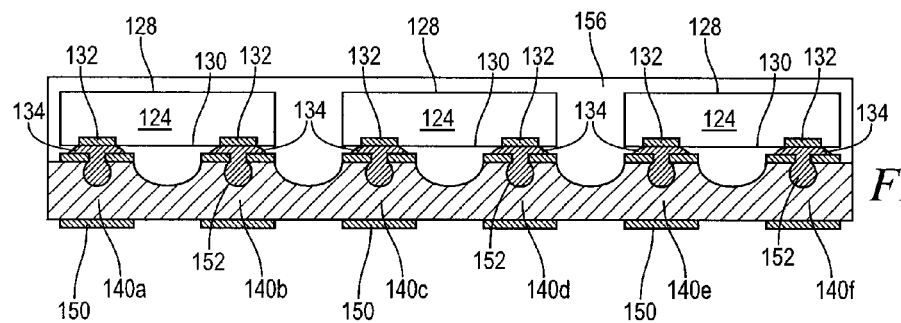

In FIG. 4i, an encapsulant or molding compound 156 is deposited over semiconductor die 124 and base substrate 140, including into cavities 154 and around base leads 140a-140f, using a paste printing, compressive molding, transfer molding, liquid encapsulant molding, vacuum lamination, spin coating, or other suitable applicator. Encapsulant 156 can be polymer composite material, such as epoxy resin with filler, epoxy acrylate with filler, or polymer with proper filler. Encapsulant 156 is non-conductive and environmentally protects the semiconductor device from external elements and contaminants. Once encapsulated, the mass of semiconductor die 124, with bumps 134 locked to base leads 140a-140f, serves to further reduce occurrence of delamination.

Figure 4J:
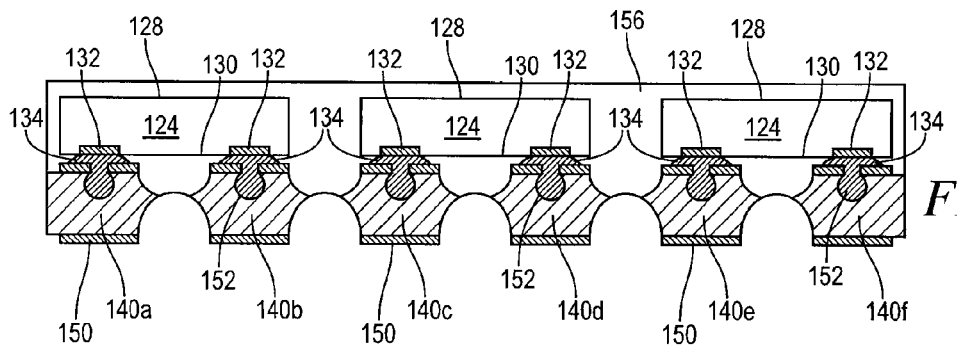

In FIG. 4j, a portion of base substrate 140g is removed by an etching process to separate and electrically isolate base leads 140a-140f into multiple rows defined by the post-etching areas of base substrate 140. The Ag/PPF plating nature of conductive layers 146 and 150 is resistant to the etching process. The etchant reacts more aggressively in removing material within base substrate 140 than with conductive layers 146 and 150. Consequently, the portion of base substrate 140 between conductive layer 150 is removed because there are no opposing conductive layers 146 and 150. On the other hand, the portion of base substrate 140 between opposing conductive layers 146 and 150, i.e., base leads 140a-140f, as well as conductive layers 146 and 150, remain intact following the etching process due to the etch-resistant nature of the conductive layers. Base leads 140a-140f provide vertical electrical connection for semiconductor die 124.

Figure 4K:
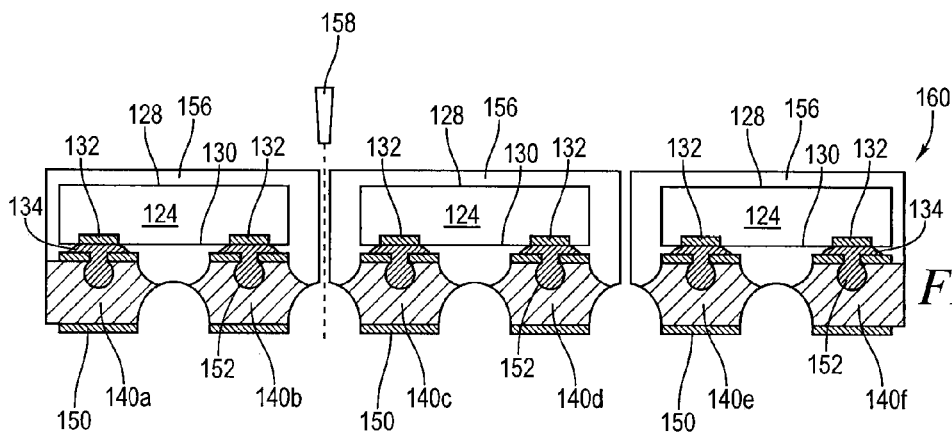

In FIG. 4k, wafer-level base substrate 140 is singulated through encapsulant 156 using saw blade or laser cutting tool 158 to separate the semiconductor die and provide individual embedded wafer-level ball grid array (eWLB), wafer-level chip scale package (WLCSP), and quad flat pack no-load (QFN) semiconductor packages 160 for further integration.

Figure 5:
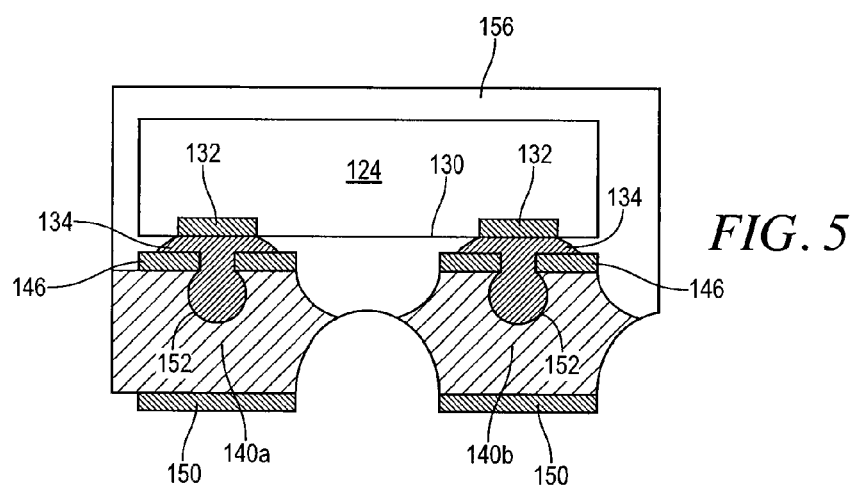
FIG. 5 illustrates the semiconductor die with bumps reflowed through the etch-resistant conductive layer into the cavities of the base substrate for bump locking.

FIG. 5 shows one such semiconductor package 160 after singulation. Semiconductor die 124 is electrically connected to base leads 140a-140b and conductive layers 146 and 150. Bumps 134 are locked into cavities 152 during reflow for a strong bond which is robust to thermal and mechanical stress. The flow of bump material into cavities 152 reduces lateral flow and risk of electrical short to adjacent base leads. The pitch between base leads can be reduced for a higher I/O count.

FIGS. 6a-6f illustrate, in relation to FIGS. 1 and 2a-2c, another process of forming a wafer-level base substrate with cavities formed through an etch-resistant conductive layer for bump locking. Continuing from FIG. 4d, bump material 162 is deposited over conductive layer 146 and into cavity 152 by using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder.

Figure 6A:
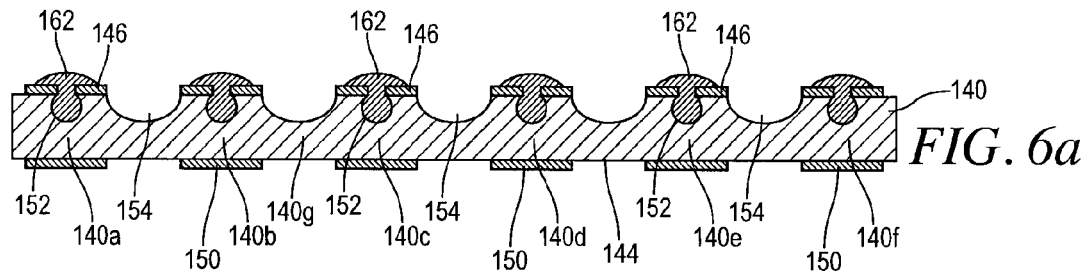
FIGS. 6a-6f illustrate another process of forming a wafer-level base substrate with cavities formed through an etch-resistant conductive layer for bump locking.
Figure 6B:
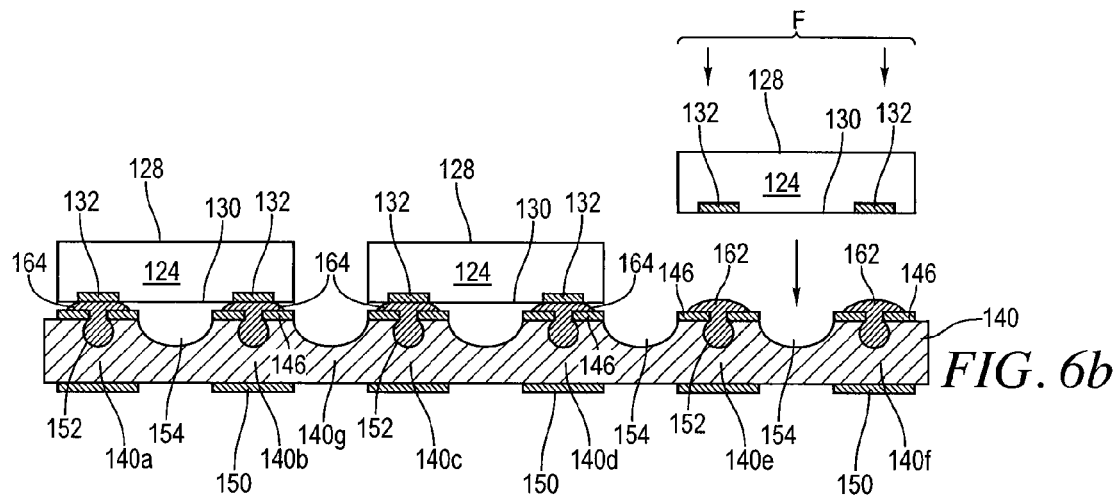
Figure 6C:
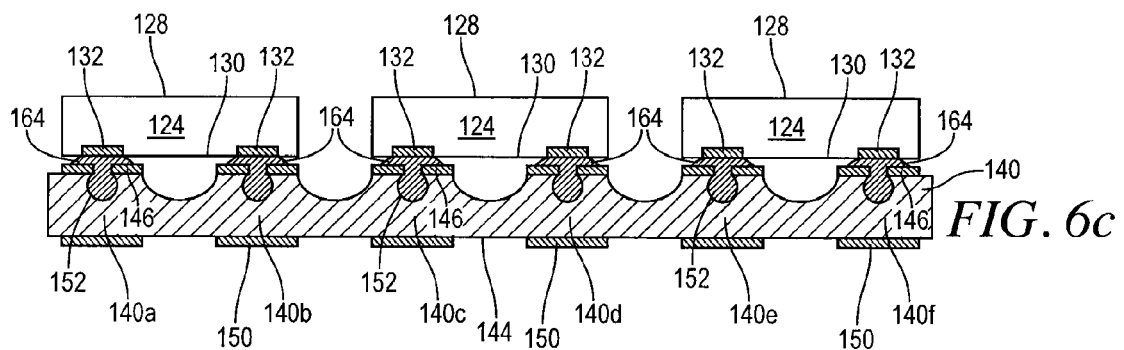

In FIGS. 6b and 6c, semiconductor die 124 from FIGS. 3a-3c, in this case without bumps 134, are positioned over and mounted to conductive layer 146 and bump material 162 using a pick and place operation. Contact pads 132 of semiconductor die 124 are metallurgically and electrically connected to conductive layer 146 by reflowing bump material 162 under reflow temperature and pressure to form electrical interconnect 164. Given the wider interior area A than the width W of opening 148, electrical interconnect 164 is locked to base leads 140a-140f. The electrical interconnect 164 is robust against detachment from conductive layer 146 by nature of the wider interior area A and narrower width W of opening 148. That is, the solidified bump material 162 within the wider interior area A will not pass through the narrower width W of opening 148 in conductive layer 146. In another embodiment, one or more discrete semiconductor components can be mounted over base leads 140a-140f.

Figure 6D:
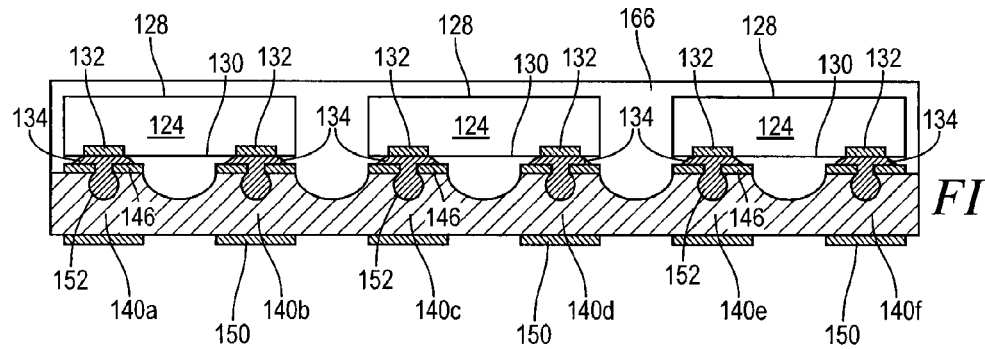

In FIG. 6d, an encapsulant or molding compound 166 is deposited over semiconductor die 124 and base substrate 140, including into cavities 154 and around base leads 140a-140f, using a paste printing, compressive molding, transfer molding, liquid encapsulant molding, vacuum lamination, spin coating, or other suitable applicator. Encapsulant 166 can be polymer composite material, such as epoxy resin with filler, epoxy acrylate with filler, or polymer with proper filler. Encapsulant 166 is non-conductive and environmentally protects the semiconductor device from external elements and contaminants. Once encapsulated, the mass of semiconductor die 124, with electrical interconnects 164 locked to base leads 140a-140f, serves to further reduce occurrence of delamination.

Figure 6E:
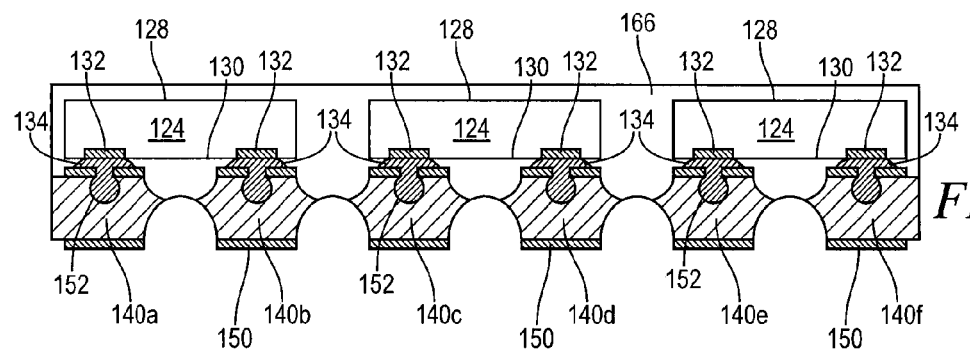

In FIG. 6e, a portion of base substrate 140g is removed by an etching process to separate and electrically isolate base leads 140a-140f into multiple rows defined by the post-etching areas of base substrate 140. The Ag/PPF plating nature of conductive layers 146 and 150 is resistant to the etching process. The etchant reacts more aggressively in removing material within base substrate 140 than with conductive layers 146 and 150. Consequently, the portion of base substrate 140 between conductive layer 150 is removed because there are no opposing conductive layers 146 and 150. On the other hand, the portion of base substrate 140 between opposing conductive layers 146 and 150, i.e., base leads 140a-140f, as well as conductive layers 146 and 150, remain intact following the etching process due to the etch-resistant nature of the conductive layers. Base leads 140a-140f provide vertical electrical connection for semiconductor die 124.

Figure 6F:
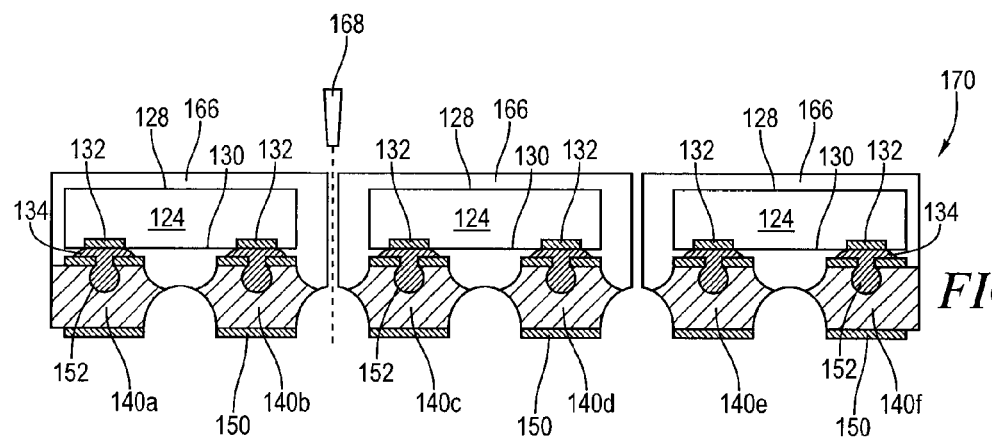

In FIG. 6f, wafer-level base substrate 140 is singulated through encapsulant 166 using saw blade or laser cutting tool 168 to separate the semiconductor die and provide individual eWLB, WLCSP, and QFN semiconductor packages 170 for further integration, similar to FIG. 5.

Figure 7A:
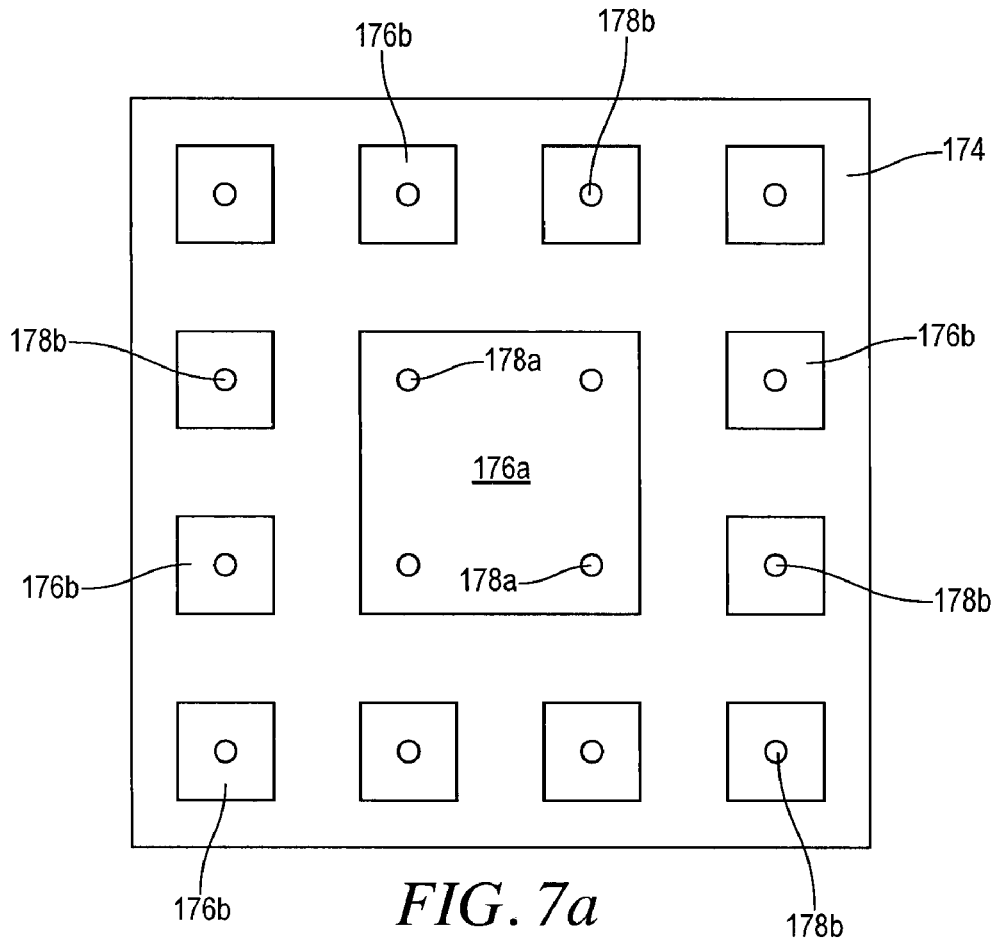
FIGS. 7a-7b illustrate another arrangement of the etch-resistant conductive layer with a central portion having a plurality of cavities formed in the base substrate.
Figure 7B:
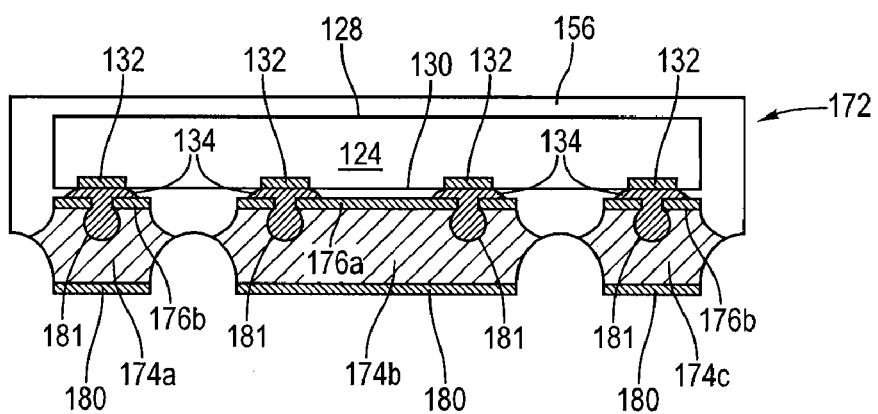

FIGS. 7a-7b show an embodiment of semiconductor package 172, similar to FIGS. 4a-4k, with another arrangement of the wafer-level base substrate or leadframe. In FIG. 7a, wafer-level base substrate or leadframe 174 includes etch-resistant conductive layer 176 with openings 178 and etch-resistant conductive layer 180 formed over opposing surfaces of the base substrate. In this case, conductive layer 176a is electrically continuous over a central or interior portion of base substrate 174 with a plurality of openings 178a in the interior conductive layer 176a. Conductive layer 176b is formed around the interior conductive layer 176a. The plurality of openings 178a provide multiple cavities 181 in base substrate 174 under the larger contact pad of conductive layer 176a, e.g., for high current power and ground connections. The multiple cavities 181 in base substrate 174 under conductive layer 176a can be interconnected with channels. Each portion of conductive layer 176b around conductive layer 176a has a single opening 178b for a single cavity 181 in base substrate 174. In FIG. 7b, after mounting semiconductor die 124 and depositing encapsulant 156, similar to FIGS. 4f-4j, the etching process electrically isolates base leads 174a, 174b, and 174c between conductive layer 176 and 180. Bumps 134 are reflowed into cavities 181 formed in base substrate 174 for the bump lock feature. Bumps 134 electrically connected to base lead 174b are electrically common.

Figure 8A:
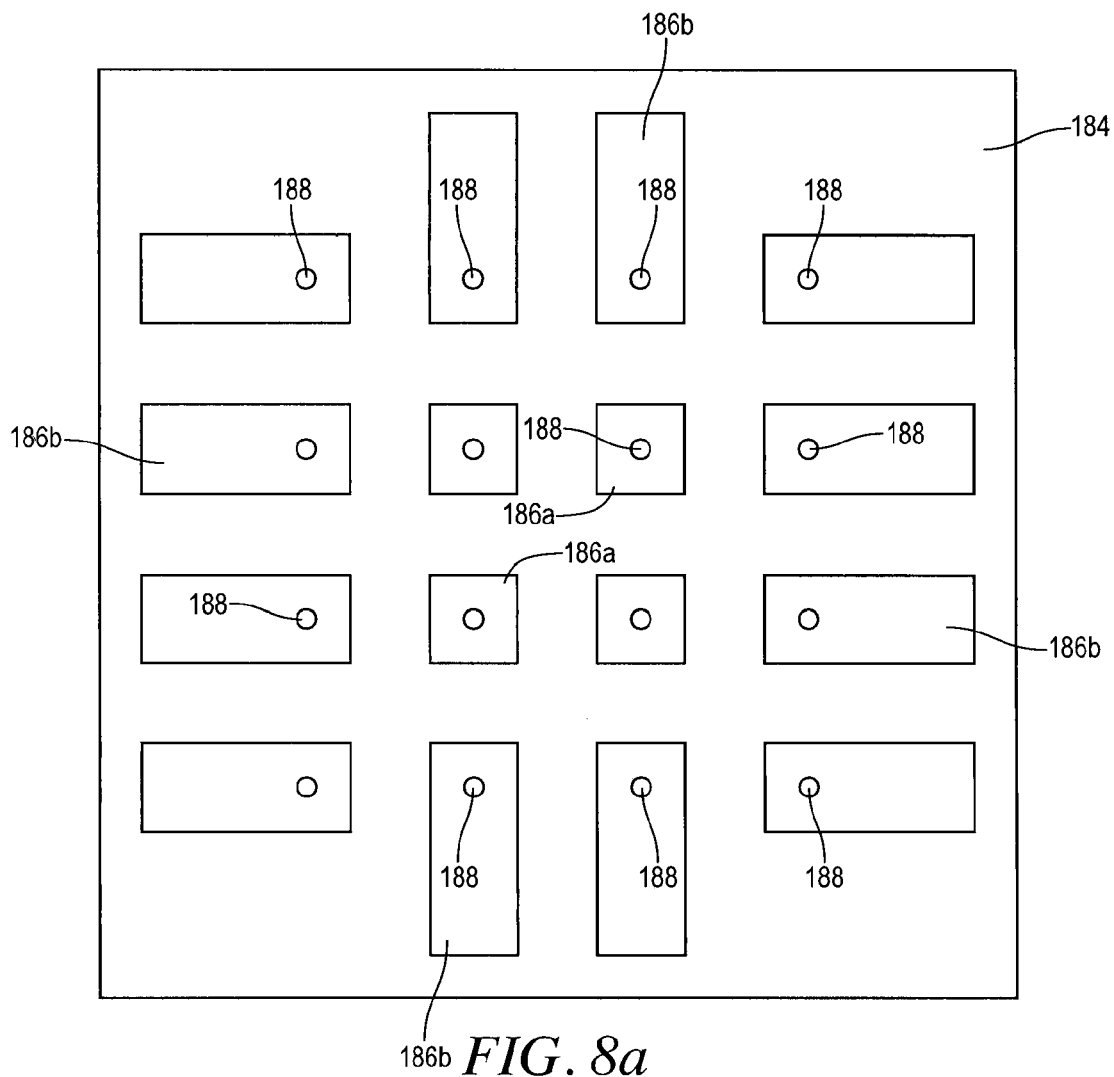
FIGS. 8a-8b illustrate another arrangement of the etch-resistant conductive layer with laterally elongated portions for forming the cavities in the base carrier.
Figure 8B:
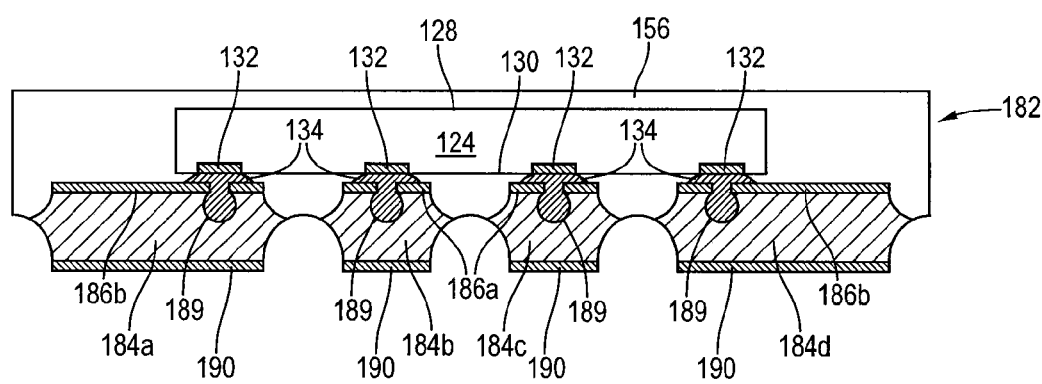

FIGS. 8a-8b show an embodiment of semiconductor package 182, similar to FIGS. 4a-4k, with another arrangement of the wafer-level base substrate or leadframe. In FIG. 8a, wafer-level base substrate or leadframe 184 includes etch-resistant conductive layer 186 with openings 188 and etch-resistant conductive layer 190 formed over opposing surfaces of the base substrate. In this case, conductive layer 186a is formed over a central or interior portion of base substrate 184, and conductive layer 186b around the interior conductive layer 186a is laterally elongated. Each conductive layer 186a and 186b has a single opening 188 for a single cavity 189 in base substrate 184. In FIG. 8b, after mounting semiconductor die 124 and depositing encapsulant 156, similar to FIGS. 4f-4j, the etching process electrically isolates base leads 184a, 184b, 184c, and 184d between conductive layers 186 and 190. Bumps 134 are reflowed into cavities 189 formed in base substrate 184 for the bump lock feature. The laterally elongated base leads 184a and 184d allow for interconnect fan-out for a higher I/O count.

FIGS. 9a-9g illustrate, in relation to FIGS. 1 and 2a-2c, another process of forming a wafer-level base substrate with cavities formed through an etch-resistant conductive layer for bump locking. FIG. 9a shows a wafer-level base substrate or leadframe 190 containing Cu, Cu alloys, Al, or other suitable conductive material. Base substrate 190 has surface 192 and opposite surface 194. Wafer-level base substrate 190 has sufficient area to process multiple semiconductor die, as described below.

An etch-resistant conductive layer 196 is formed over surface 192 of base substrate 190 using patterning and an electrolytic plating or electroless plating process. The location of conductive layer 196 over base substrate 190 corresponds to bump sites of subsequently mounted semiconductor die. An etch-resistant conductive layer 198 is formed over surface 194 of base substrate 190 using patterning and an electrolytic plating or electroless plating process. Conductive layers 196 and 198 can be one or more layers of Al, Cu, Sn, Ni, Au, Ag, or other suitable electrically conductive material. In one embodiment, conductive layer 196 and 198 are Ag or Au on a preplated leadframe. Conductive layers 196 and 198 operate as contact pads for later mounted semiconductor die or interconnect structures, such as bumps.

An opening 200 is formed in a central area of each portion of conductive layer 198. The opening 200 can be formed by selective patterning or by removing a portion of conductive layer 198. FIG. 9b shows a plan view of openings 200 in conductive layer 198 over base substrate 190.

In FIG. 9c, base substrate 190 is etched partially through surface 192 to form cavities 202 between adjacent portions of conductive layer 196. The Ag/PPF plating nature of conductive layer 196 is resistant to the etching process. The etchant reacts more aggressively in removing material within base substrate 190 than with conductive layer 196. Consequently, cavities 202 create multiple rows of base leads or protrusions 190a, 190b, 190c, 190d, 190e, and 190f, extending from the remaining base substrate 190g.

In FIG. 9d, semiconductor die 124 from FIGS. 3a-3c are positioned over and mounted to conductive layer 196 over base leads 190a-190f using a pick and place operation. Bumps 134 are metallurgically and electrically connected to conductive layer 196.

In FIG. 9e, an encapsulant or molding compound 204 is deposited over semiconductor die 124 and base substrate 190, including into cavities 202, using a paste printing, compressive molding, transfer molding, liquid encapsulant molding, vacuum lamination, spin coating, or other suitable applicator. Encapsulant 204 can be polymer composite material, such as epoxy resin with filler, epoxy acrylate with filler, or polymer with proper filler. Encapsulant 204 is non-conductive and environmentally protects the semiconductor device from external elements and contaminants.

Base substrate 190 is etched partially through surface 194 to form cavities 206 through openings 200. The Ag/PPF plating nature of conductive layer 198 is resistant to the etching process. The etchant reacts more aggressively in removing material within base substrate 190 than with conductive layer 198. Consequently, cavities 206 have a wider interior area A than the diameter or width D of opening 200, similar to FIG. 4e. In one embodiment, cavities 206 are etched to a depth of 50-75 μm to ensure robust base leads 190a-190f. The etching process also removes the portion of base substrate 190g to separate and electrically isolate base leads 190a-190f into multiple rows defined by the post-etching areas of base substrate 190. The portion of base substrate 190 between conductive layer 198 is removed because there are no opposing etch-resistant conductive layers. Therefore, base leads 190a-190f and conductive layers 196 and 198 remain intact following the etching process. Base leads 190a-190f provide vertical electrical connection for semiconductor die 124.

In FIG. 9f, wafer-level base substrate 190 is singulated through encapsulant 204 using saw blade or laser cutting tool 208 to separate the semiconductor die and provide individual eWLB, WLCSP, and QFN semiconductor packages 210 for further integration.

In FIG. 9g, PCB 212 has contact pads 214 with bump material 216 deposited on the contact pads. Semiconductor package 210 is mounted over contact pads 214. Bump material 216 is reflowed and a force F can be applied to the back surface of semiconductor package 210 to assist with inserting the liquidus bump material into cavity 206 of base leads 190a-190f. The requisite force to engage bump material 216 within cavities 206 can be achieved in a vacuum. Given the wider interior area A than the width W of opening 200, bump material 216 is locked to cavities 206 of base leads 190a-190f. Bump material 216 is robust against detachment from conductive layer 146 by nature of the wider interior area A and narrower width W of opening 200. That is, the solidified bump material within the wider interior area A will not pass through the narrower width W of opening 200 in conductive layer 198.

Figure 10:
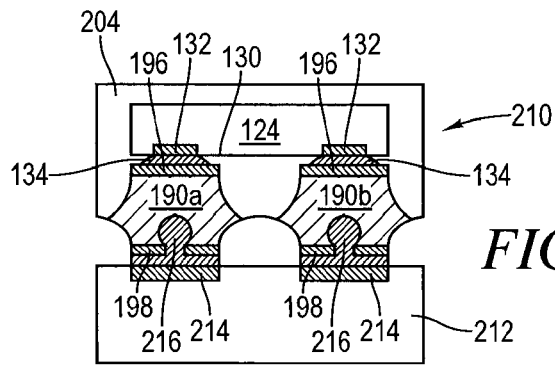
FIG. 10 illustrates the bump material reflowed through the etch-resistant conductive layer into the cavities of the base substrate.

FIG. 10 shows semiconductor package 210 mounted over PCB 212. Semiconductor die 124 is electrically connected to base leads 190a-190b and conductive layers 196 and 198. Bump material 216 is locked into cavities 206 during reflow for a strong bond which is robust to thermal and mechanical stress. The flow of bump material into cavities 206 reduces lateral flow and risk of electrical short to adjacent base leads. The pitch between base leads can be reduced for a higher I/O count.

Figure 11A:
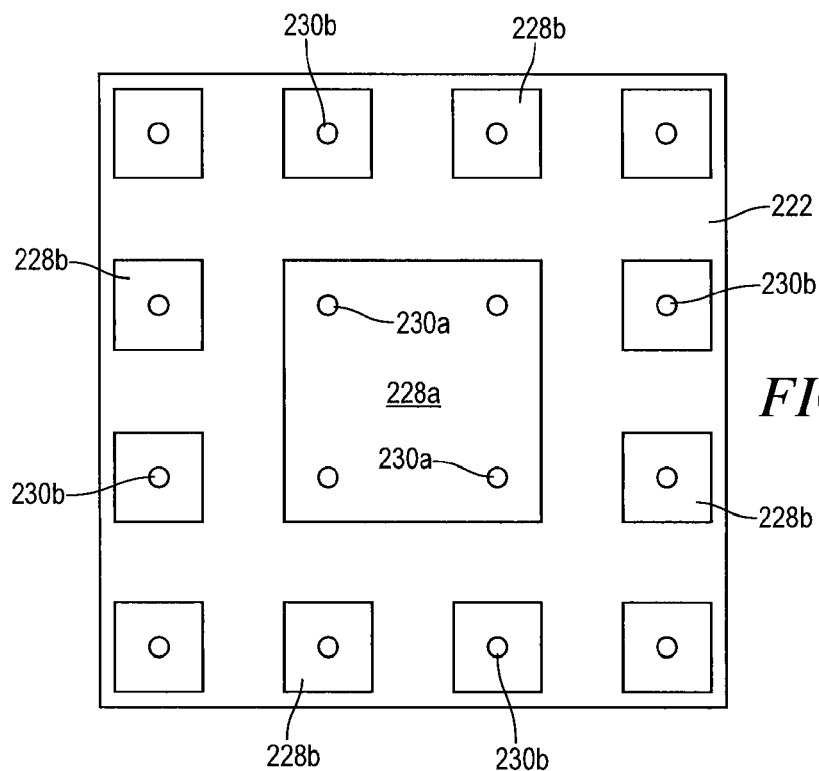
FIGS. 11a-11b illustrate another arrangement of the etch-resistant conductive layer with a central portion having a plurality of cavities formed in the base substrate.
Figure 11B:
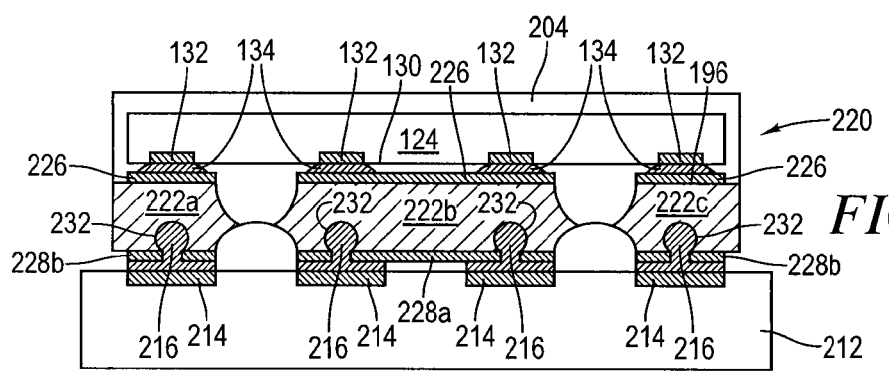

FIGS. 11a and 11b show an embodiment of semiconductor package 220, similar to FIGS. 9a-9g, with another arrangement of the wafer-level base substrate or leadframe. Wafer-level base substrate or leadframe 222 includes etch-resistant conductive layer 226 and etch-resistant conductive layer 228 with openings 230 formed over opposing surfaces of the base substrate. In this case, conductive layer 228 is electrically continuous over a central or interior portion of base substrate 222 with a plurality of openings 230a in the interior conductive layer 228a, as shown in FIG. 11a. The plurality of openings 230a provide multiple cavities 232 in base substrate 222 under the larger contact pad of conductive layer 228a, e.g., for high current power and ground connections. The multiple cavities 232 in base substrate 222 under conductive layer 228a can be interconnected with channels. Each portion of conductive layer 228b around conductive layer 228a has a single opening 230b. In FIG. 11b, after mounting semiconductor die 124 and depositing encapsulant 204, similar to FIGS. 9d-9f, the etching process electrically isolates base leads 222a, 222b, and 222c between conductive layer 226 and 228. Bumps 134 are reflowed into cavities 232 formed in base substrate 222 for the bump lock feature. Bumps 134 electrically connected to base lead 222b are electrically common.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a base substrate having first and second opposing surfaces;
   forming a first etch-resistant conductive layer over the first surface of the base substrate;
   etching a plurality of first cavities in the base substrate through an opening in the first etch-resistant conductive layer, the first cavities having a width greater than a width of the opening in the first etch-resistant conductive layer;
   etching a plurality of second cavities in the base substrate between portions of the first etch-resistant conductive layer;
   providing a semiconductor die having a plurality of bumps formed over contact pads on an active surface of the semiconductor die;

mounting the semiconductor die to the base substrate with the bumps disposed over the first etch-resistant conductive layer;

reflowing the bumps to electrically connect to the first etch-resistant conductive layer and cause bump material to flow into the first cavities;

depositing an encapsulant over the semiconductor die and base substrate; and removing a portion of the second surface of the base substrate down to the second cavities to form electrically isolated base leads under the first etch-resistant conductive layer.

2. The method of claim 1, wherein the bump material in the first cavities locks the bumps to the base leads.

3. The method of claim 1, further including forming a second etch-resistant conductive layer over the second surface of the base substrate.

4. The method of claim 1, wherein a portion of the first etch-resistant conductive layer includes a plurality of openings.

5. The method of claim 1, wherein the first etch-resistant conductive layer includes a laterally elongated portion.

6. The method of claim 1, further including:
depositing a second bump material in the first cavities prior to mounting the semiconductor die;
mounting the semiconductor die to the base substrate with the bumps disposed over the first etch-resistant conductive layer; and
reflowing the bumps to metallurgically join with the second bump material in the first cavities.

7. A method of making a semiconductor device, comprising:
providing a base substrate including first and second opposing surfaces;
forming a first conductive layer over the first surface of the base substrate;
forming a first cavity in the base substrate through an opening in the first conductive layer;
forming a second conductive layer over the second surface of the base substrate;
forming a second cavity in the base substrate between portions of the first conductive layer or second conductive layer;
mounting a semiconductor die to the first conductive layer by disposing bump material within the first cavity;
depositing an encapsulant over the semiconductor die and base substrate; and
removing a portion of the base substrate down to the second cavity to form electrically isolated base leads between the first and second conductive layers.

8. The method of claim 7, wherein the first conductive layer and second conductive layer include an etch-resistant material.

9. The method of claim 7, wherein the first cavity has a width greater than a width of the opening in the first conductive layer.

10. The method of claim 7, further including:
mounting the semiconductor die to the base substrate with the bump material disposed over the first conductive layer; and
reflowing the bump material to electrically connect the semiconductor die to the first conductive layer and cause the bump material to flow into the first cavity.

11. The method of claim 7, further including:
providing a printed circuit board (PCB); and
mounting the base leads of the semiconductor device to the PCB.

12. The method of claim 7, further including:
mounting the semiconductor die to the base substrate with the bump material disposed over the first conductive layer; and
reflowing the bump material to cause bump material to flow into the first cavity.

13. The method of claim 7, further including:
depositing the bump material over the first conductive layer; and
reflowing the bump material into the first cavity.

14. The method of claim 7, further including:
mounting the semiconductor die to the base substrate with a bump disposed over the first conductive layer; and
using thermo-compression to electrically connect the semiconductor die to the first conductive layer and the first cavity.

15. A method of making a semiconductor device, comprising:
providing a base substrate;
forming a first conductive layer over a first surface of the base substrate;
forming a cavity in the base substrate through an opening in the first conductive layer;
depositing bump material over the first conductive layer;
mounting a semiconductor die to the base substrate;
reflowing the bump material into the cavity;
depositing an encapsulant over the semiconductor die and base substrate; and
removing a portion of the base substrate to form electrically isolated base leads under the first conductive layer.

16. The method of claim 15, wherein the first conductive layer includes an etch-resistant material.

17. The method of claim 15, wherein the cavity has a width greater than a width of the opening in the first conductive layer.

18. The method of claim 15, further including forming a second conductive layer over a second surface of the base substrate, opposite the first surface of the base substrate.

19. The method of claim 15, wherein the bump material in the cavity locks the semiconductor die to the base leads.

20. The method of claim 15, wherein the first conductive layer includes a laterally elongated portion.

* * * * *